United States Patent
Wuister et al.

(10) Patent No.: US 9,513,553 B2
(45) Date of Patent: Dec. 6, 2016

(54) METHODS OF PROVIDING PATTERNED EPITAXY TEMPLATES FOR SELF-ASSEMBLABLE BLOCK COPOLYMERS FOR USE IN DEVICE LITHOGRAPHY

(71) Applicant: ASML Netherlands B.V., Veldhoven (NL)

(72) Inventors: Sander Frederik Wuister, Eindhoven (NL); Vadim Yevgenyevich Banine, Deurne (NL); Jozef Maria Finders, Veldhoven (NL); Roelof Koole, Eindhoven (NL); Emiel Peeters, Eindhoven (NL); Harmeet Singh, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 59 days.

(21) Appl. No.: 14/387,186

(22) PCT Filed: Mar. 19, 2013

(86) PCT No.: PCT/EP2013/055681
§ 371 (c)(1),
(2) Date: Sep. 22, 2014

(87) PCT Pub. No.: WO2013/152928
PCT Pub. Date: Oct. 17, 2013

(65) Prior Publication Data
US 2015/0050599 A1    Feb. 19, 2015

Related U.S. Application Data

(60) Provisional application No. 61/623,894, filed on Apr. 13, 2012.

(51) Int. Cl.
G03F 7/20 (2006.01)
G03F 7/26 (2006.01)
(Continued)

(52) U.S. Cl.
CPC . G03F 7/26 (2013.01); B05D 1/32 (2013.01); B05D 3/107 (2013.01); B82Y 10/00 (2013.01);
(Continued)

(58) Field of Classification Search
CPC .................................................. G03F 7/26
See application file for complete search history.

(56) References Cited

U.S. PATENT DOCUMENTS 7,521,090 B1    4/2009  Cheng et al.
7,521,094 B1    4/2009  Cheng et al.
(Continued)

FOREIGN PATENT DOCUMENTS

KR    2010089021    * 10/2010
WO    2011/128120    10/2011
(Continued)

OTHER PUBLICATIONS

Machine translation of KR 2010089021, Dec. 31, 2015.*
(Continued)

*Primary Examiner* — Kathleen Duda
(74) *Attorney, Agent, or Firm* — Pillsbury Winthrop Shaw Pittman LLP

(57) ABSTRACT

A method is disclosed to form a patterned epitaxy template, on a substrate, to direct self-assembly of block copolymer for device lithography. A resist layer on a substrate is selectively exposed with actinic (e.g. UV or DUV) radiation by photolithography to provide exposed portions in a regular lattice pattern of touching or overlapping shapes arranged to leave unexposed resist portions between the shapes. Exposed or unexposed resist is removed with remaining
(Continued)

resist portions providing the basis for a patterned epitaxy template for the orientation of the self-assemblable block copolymer as a hexagonal or square array. The method allows for simple, direct UV lithography to form patterned epitaxy templates with sub-resolution features.

21 Claims, 9 Drawing Sheets

(51) Int. Cl.
    *G03F 7/00*     (2006.01)
    *B82Y 10/00*     (2011.01)
    *B82Y 40/00*     (2011.01)
    *B05D 1/32*     (2006.01)
    *B05D 3/10*     (2006.01)

(52) U.S. Cl.
    CPC ............ *B82Y 40/00* (2013.01); *G03F 7/0002* (2013.01); *G03F 7/20* (2013.01); *G03F 7/2022* (2013.01)

(56) References Cited

U.S. PATENT DOCUMENTS

| | | |
|---|---|---|
| 2002/0172901 A1 | 11/2002 | Tokushima |
| 2009/0323385 A1 | 12/2009 | Scheuerlein et al. |
| 2010/0294740 A1 | 11/2010 | Cheng et al. |
| 2010/0297847 A1 | 11/2010 | Cheng et al. |
| 2011/0147984 A1 | 6/2011 | Cheng et al. |

FOREIGN PATENT DOCUMENTS

| | | |
|---|---|---|
| WO | 2012/084558 | 6/2012 |
| WO | 2013/010730 | 1/2013 |

OTHER PUBLICATIONS

International Search Report mailed Jul. 5, 2013 in corresponding International Patent Application No. PCT/EP2013/055681.

Jae-Byum Chang et al., "Aligned Sub-10-nm Block Copolymer Patterns Templated by Post Arrays," ACS Nano, vol. 6, No. 3, pp. 2071-2077 (Feb. 22, 2012).

Miri Park et al., "Block Copolymer Lithography: Periodic Arrays of ~$10^{11}$ Holes in 1 Square Centimeter," Science, vol. 276, pp. 1401-1404 (May 30, 1997).

Joy Y. Cheng et al., "Simple and Versatile Methods to Integrate Directed Self-Assembly with Optical Lithography Using a Polarity-Switched Photoresist," ACS Nano, vol. 4, No. 8, pp. 4815-4823 (2010).

Seung Hak Park et al., "Block copolymer multiple patterning integrated with conventional ArF lithography," Soft Matter, vol. 6, pp. 120-125 (2010).

\* cited by examiner

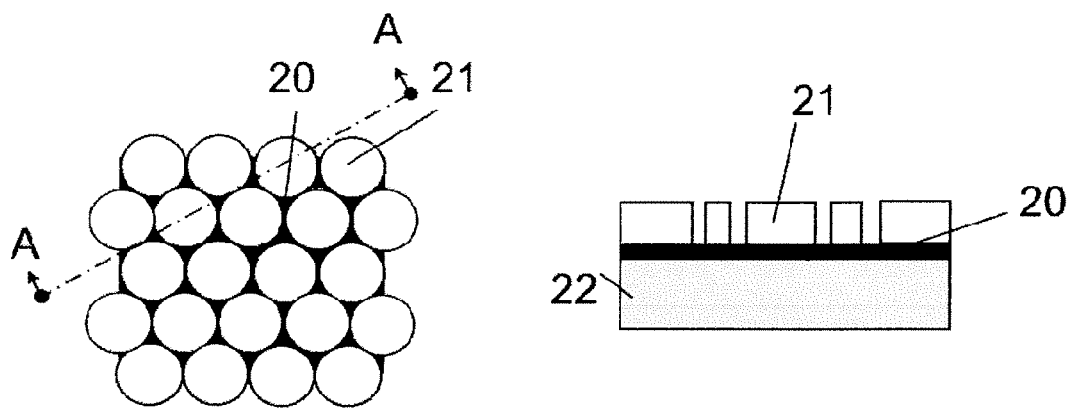
*Fig. 6A*  *Fig. 6B*
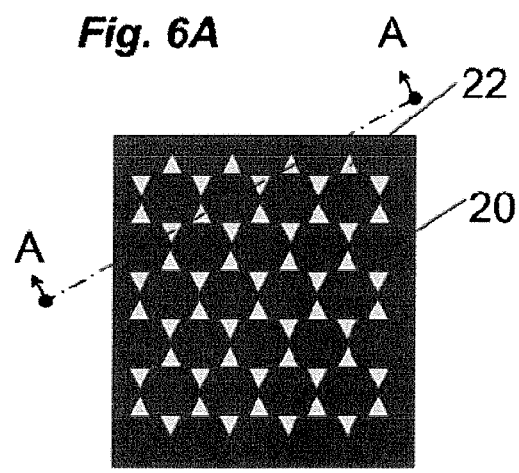
*Fig. 6C*  *Fig. 6D*
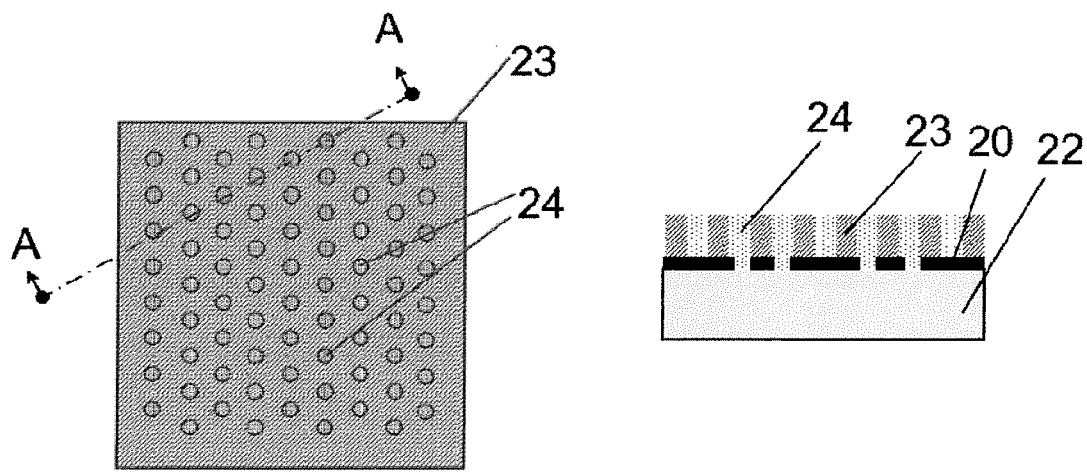
*Fig. 6E*  *Fig. 6F*

METHODS OF PROVIDING PATTERNED EPITAXY TEMPLATES FOR SELF-ASSEMBLABLE BLOCK COPOLYMERS FOR USE IN DEVICE LITHOGRAPHY

CROSS-REFERENCE TO RELATED APPLICATIONS

This application is the U.S. national phase entry of PCT patent application no. PCT/EP2013/055681, which was filed on Mar. 19, 2013, which claims the benefit of priority of U.S. provisional application No. 61/623,894, which was filed on Apr. 13, 2012, which is incorporated herein in its entirety by reference.

FIELD

The present invention relates to a method of forming a patterned epitaxy template to direct self-assembly of a self-assemblable block copolymer on a surface of a substrate. The invention also relates to formation of a self-assembled polymer layer on such a substrate and a method for device lithography using a resist layer of self-assembled copolymer deposited and assembled on such a substrate using a patterned epitaxy template to direct self-assembly.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometres or even less than 10 nm. The size and shape of the domains may be controlled by manipulating the molecular weight and composition of the different block types of the copolymer. The interfaces between the domains may have a line width roughness of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) block copolymer may be useful, as may an alternating or periodic block copolymer e.g. [-A-B-A-B-A-B-]$_n$ or [-A-B-C-A-B-C]$_m$ where n and m are integers. The blocks may be connected to each other by covalent links in a linear or branched fashion (e.g., a star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the phases formed. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At 50:50 ratio, a lamellar phase is formed. With a ratio of 30:70, an inverted cylindrical phase may be formed and at a ratio of 20:80, an inverted cubic phase may be formed.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may provide a resist to form line and space patterns and hole arrays, respectively, when oriented with their domains lying side-by-side on a substrate, and may provide good contrast when one of the domain types is subsequently etched.

Two methods used to guide or direct self-assembly of a polymer, such as a block copolymer, onto a surface are graphoepitaxy and chemical pre-patterning, also called chemical epitaxy. In the graphoepitaxy method, self-organization of block copolymer is guided by topological pre-patterning on the substrate. Lamellar self-assembled block copolymer can form parallel linear patterns with adjacent lines of the different polymer block domains in the enclosures or trenches defined by one or more side walls of the graphoepitaxy template. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the graphoepitaxy template by a side wall being spaced to fit several domains of the block copolymer side-by-side. For hexagonal or tetragonal (cylindrical) ordered patterns, the graphoepitaxy features may be pillars standing in place of cylindrical domains of the ordered pattern of the block copolymer.

In the chemical pre-patterning method (referred to herein as chemical epitaxy), the self-assembly of block copolymer domains is guided by a chemical pattern (i.e. a chemical epitaxy template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical epitaxy pattern may comprise a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of the pre-patterned features on the substrate (so-called density or pitch multiplication). As was the case with graphoepitaxy, chemical pre-patterning is not limited to a linear pre-pattern; for instance the chemical epitaxy template may be in the form of a 2-D array of dots suitable as a pattern for use with a cylindrical (e.g. hexagonal or square pattern) phase-forming block copolymer. Graphoepitaxy and chemical pre-patterning may be used, for instance, to guide the self-organization of lamellar or cylindrical phases, so that the different domain types are arranged side-by-side on a surface of a substrate.

Typically, the height of features of a graphoepitaxy template may be of the order of the thickness of the block copolymer layer to be ordered, so may be, for instance, from 20 nm to 150 nm whereas for a chemical epitaxy template, the height difference between adjacent regions of a chemical epitaxy template will typically be less than about 15 nm, say less than about 10 nm or even less than about 5 nm in order to reduce or minimize likelihood of defect formation.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between adjacent domains of different blocks lying substantially perpendicular to the plane of the surface.

A neutral surface for use in chemical epitaxy and graphoepitaxy is particularly useful. It may be used on surfaces between specific orientation regions of an epitaxy template. For instance in a chemical epitaxy template to align a di-block copolymer having A and B blocks, where A is hydrophilic and B is hydrophobic in nature, the chemical pattern may comprise hydrophobic pinning sites with a neutral orientation region between the hydrophobic sites. The B domain may preferentially assemble onto the hydrophobic pinning sites, with several alternating domains of A and B blocks aligned over the neutral region between the specific (pinning) orientation regions of the chemical epitaxy template.

For instance in a graphoepitaxy template to align such a di-block copolymer the pattern may comprise hydrophobic resist features as pillars or side-walls with a neutral orientation region between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 40 nm, or less than or equal to 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable block copolymer may be deposited onto a substrate with a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare.

It would be desirable, for example, to have one or more processes and methods to form a patterned graphoepitaxy or chemical epitaxy template where the pattern may be formed using direct photolithographic patterning of a layer, for instance using actinic radiation such as UV or DUV radiation. For example, it would be desirable to provide a patterned chemical epitaxy template by direct photolithographic patterning of a substrate so that pinning sites are formed in or on the substrate. It is desirable, for example, that the patterned epitaxy template is not exposed to development, strip or etch media that may alter or modify the surface properties of the patterned chemical epitaxy template.

Cheng et al. (Y. Cheng et al, ACS Nano, 2010, 4(8), 4815) showed that it is possible to start with a substrate provided with an appropriate anti-reflection coating (ARC) and spin-coat a polarity switched 193 nm photoresist onto the ARC. After lithographic exposure, the chemically enhanced photoresist is developed in a positive tone and the remaining features trimmed to 30 nm line width. Subsequently, a 193 nm flood exposure and post exposure bake is applied to harden the resist pattern. A crosslinkable neutral orientation layer is then spin-coated and cured, covering both the open substrate areas as well as the resist features. Finally, the resist features and the crosslinked orientation layer attached to the resist features, are removed by lift-off resulting in a sparse chemical epitaxy pattern consisting of alternating regions of neutral orientation layer with regions of bare ARC. Subsequently, a suitable block copolymer is deposited via spin-coating and annealed.

Park et al. (S. H. Park et al, Soft Matter 2010, 6, 120) have reported a different method to obtain a chemical pre-pattern. The method starts with a substrate with ARC coating, neutral orientation layer and positive tone photoresist. After lithographic exposure and development, thermal reflow is used to shrink the openings in the resist to dimensions that are desirable for chemical epitaxy. Subsequently, the neutral orientation layer is etched away in the narrowed resist openings and finally the resist is stripped to generate the chemical pre-pattern. A suitable block copolymer is deposited via spin-coating and annealed.

It is also desirable, for example when forming a 2D patterned epitaxy template to direct self-assembly of a block copolymer into ordered cylindrical phases, providing hexagonal or square arrays of domains, that the pattern features should be of small size (width or diameter of say 30 nm or less) and that the spacing between adjacent features should be as small as possible—say 50 nm or less.

It is desirable, for example, is to provide a simple method of providing such a patterned epitaxy template, including a graphoepitaxy and/or chemical epitaxy template, on a substrate surface, for use in directing self-assembly of a layer of block copolymer in a 2D array for subsequent use of the ordered block copolymer as a resist layer suitable for use in device lithography, for instance to form an array of contact electrodes for a dynamic random-access memory device. It is desirable, for example, to provide a method using photolithography, for instance with actinic radiation such as UV or DUV radiation, to form such a template. It is desirable, for example, to provide a patterned epitaxy template to direct self-assembly of a polymer which addresses or overcomes one or more of the problems in the art for patterned epitaxy templates. For instance, it is desirable to provide a method which removes or reduces the need for chemical treatment of the patterned chemical epitaxy template after exposure to radiation.

It is desirable, for example, to provide a template to direct self-assembly of a polymer which is capable of directing self-assembly of a block copolymer to produce a self-assembled block copolymer layer with low defectivity. It is desirable, for example, to provide a patterned epitaxy template with small pattern feature size and spacing compared to patterns in the art prepared using photolithography.

In embodiment, there is provided a method of forming a patterned epitaxy template on a substrate, for orientation of a self-assemblable block copolymer, the method comprising:

selectively exposing a resist layer on a substrate with actinic radiation by a photolithographic method to provide exposed resist portions in a regular lattice pattern of touching or overlapping shapes arranged to leave unexposed resist portions therebetween, and removing the exposed resist portions or the unexposed resist portions to leave the remaining resist portions on the substrate, separated by portions of bared substrate, wherein the remaining resist portions provide a basis for the patterned epitaxy template.

In an embodiment, there is provided a method of forming an ordered block copolymer layer on a surface of a substrate, the method comprising:

providing a surface of a substrate, having a patterned epitaxy template thereon, the patterned epitaxy template provided by a method described herein, depositing a self-assemblable block copolymer layer directly onto the patterned epitaxy template, and treating the self-assemblable block copolymer layer to provide self-assembly into an ordered block copolymer layer, with the ordering directed by the patterned epitaxy template.

In an embodiment, there is provided a lithography method for patterning a surface of a substrate by resist etching, wherein the method comprises providing an ordered block copolymer layer at the surface by a method described herein, wherein the ordered block copolymer layer is subsequently used as a resist layer.

In an embodiment, there is provided a method of forming a device topography at a surface of a substrate, the method comprising using the ordered block copolymer layer, formed by a method described herein, as a resist layer while etching the substrate to provide the device topography.

The following features are applicable to all the various embodiments of the invention where appropriate. When suitable, combinations of the following features may be employed as part of the methods herein, for instance as set out in the claims. The methods herein are particularly suitable for use in device lithography. For instance the methods may be used for treatment or formation of a resist layer of self-assembled polymer for use in patterning a device substrate directly or for use in patterning an imprint template for use in imprint lithography. In particular, the resist layer of ordered block copolymer, having a 2D array of discontinuous domains in a square or hexagonal lattice, may be of use for forming an array of contact electrodes for DRAM (Dynamic Random-Access Memory) devices, such as for the storage node or storage node contacts.

The self-assemblable block copolymer may be a block copolymer as set out hereinbefore comprising at least two different block types, referred to as first and second polymer blocks, which are self-assemblable into an ordered polymer layer having the different block types associated into first and second domain types. The block copolymer may be a di-block copolymer or a tri-block or multi-block copolymer. An alternating or periodic block copolymer may also be used as the self-assemblable polymer. Although only two domain types may be mentioned in some of the following aspects and examples, an embodiment of the invention is also applicable to a self-assemblable polymer with three or more different domain types. The self-assemblable block copolymer is desirably a di-block copolymer.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

By "bonding" or "linking" as referred to herein, it is meant that a bond such as a covalent bond, ionic bond or hydrogen bond is present, either within a molecule, or between a surface and a molecule, i.e. a bond stronger than mere van der Waals attraction. Desirably, the bonding or linking referred to herein is covalent or ionic bonding, more desirably covalent bonding.

In an embodiment, the method involves providing a resist layer on the substrate. The resist layer forms an interface with the substrate and also has an outer face opposed to the interface (in other words, on the opposite side of the resist layer to the interface with the substrate). The resist layer may be provided by any suitable method, such as spin coating of a resist solution in a solvent followed by evaporative drying to provide the resist layer on the substrate. By a positive tone resist, is meant a resist which, after exposure to actinic radiation, becomes or is rendered removable (such as soluble in a solvent so that when subjected to rinsing with the solvent, an exposed portion of the resist is washed away while an unexposed portion of the resist remains insoluble in the solvent). For a negative tone resist, an unexposed portion of the resist is removable while an exposed portion of the resist is rendered irremovable (for instance rendered insoluble in a solvent for the unexposed resist) and so remains.

The substrate may typically be a semiconductor substrate, and may comprise a plurality of layers forming the substrate. For instance, the outermost layer of the substrate upon which the resist layer is provided, may be an ARC (anti-reflection coating) layer. Other arrangements for the substrate and its outermost layer, in relation to certain embodiments of the invention, are set out hereinafter.

The method may involve selectively exposing the resist layer with actinic radiation by a photolithographic method to provide exposed resist portions in a regular lattice pattern of touching or overlapping shapes (e.g., circles) arranged to leave unexposed resist portions therebetween. The actinic radiation may be UV radiation such as DUV (deep UV) or EUV (Extreme UV). The selective exposure to actinic radiation may be by patterning of the UV radiation with a lithography apparatus. A conventional lithographic patterning method, such as mask or maskless UV lithography, may be used to provide a desired high resolution exposure pattern on the resist layer to give the exposed and unexposed regions. Typical DUV lithography is carried out using UV radiation having a wavelength of about 193 nm.

Following exposure to actinic radiation, either the exposed or the unexposed resist portions are removed, for instance by washing with a solvent that dissolves the selected resist portions, with the other resist portions left as remaining resist portions on the substrate, separated by portions of bared substrate. The remaining resist portions provide the patterned epitaxy template for the orientation of the self-assemblable block copolymer. One or more other methods for removal of the undesired resist portions may be employed, such as vapor etching or the like.

By regular lattice pattern, it is meant that the touching or overlapping shapes (e.g., circles) have substantially the same width (e.g., diameter) and are substantially uniformly spaced throughout the lattice pattern, substantially meaning, in this case, within the precision of the photolithography method used for achieving the selective exposure of the resist layer. It will be understood that the reference to shapes or circles applies to the shapes exposed at the outer face of the resist layer, and the exposed portions within the resist layer may be in the form of cylinders, frusto-conical regions or the like, having a particular cross-section at the outer face of the resist layer and extending through the resist layer from the outer face to the interface.

The regular lattice pattern may be a hexagonal pattern, or the regular lattice pattern may be a square pattern. The unexposed portions, at the outer face, will be in the form of equilateral triangles (with curved sides), for a hexagonal pattern, and in the form of equilateral quadrangles (with curved sides), for a square pattern.

The photolithographic method will have a resolution, and this may be defined by, for example, the minimum diameter for exposing a shape (e.g. a circle) of which the method is capable. In other words, it is not possible to directly expose shapes having a width (e.g., diameter) less than the minimum width using the photolithographic method. The unexposed portions of the resist layer may have a maximum width, measured about any axis parallel to the substrate surface and passing through the centroid of any unexposed portion, less than the minimum width. The unexposed resist portions at the interface with the substrate may thus have a width less than the minimum width which the photolithographic method used is capable of achieving for exposure of a particular shape at the outer face of the resist layer. The remaining resist portions may also be referred to as sub-resolution features, and may have widths of the order of about 30 nm or less when DUV radiation, for instance, is used as actinic radiation for photolithography.

Where the regular lattice pattern is a hexagonal pattern, it follows from the geometry of the situation that where the spacing between the centroids of adjacent, exposed circles in the regular lattice pattern is D, with the diameter of the circles being equal to D or greater than D (up to a value less than $2D/(3)^{1/2}$), the spacing between the centroids of adjacent unexposed portions of the resulting pattern of unexposed portions will be $D/(3)^{1/2}$. When the value of the diameter of the circles is equal to $2D/(3)^{1/2}$, or greater, there may be no unexposed portions remaining therebetween.

The remaining resist portions may be the unexposed resist portions. The patterned epitaxy template resulting from the remaining unexposed resist portions may be a graphoepitaxy template formed from the remaining resist portions.

For instance, the remaining resist portions may remain at the interface as alignment pillars of the patterned epitaxy template as a graphoepitaxy template, the remaining resist features having a higher chemical affinity for one block, than for the other block, of the block copolymer and the bared substrate having a similar chemically affinity for both the first and second blocks of the block copolymer. Typically, for such an arrangement, the remaining resist portions, acting as alignment pillars of a graphoepitaxy template, will have a height corresponding to that of the original resist layer. The block copolymer will suitably be adapted to self-assemble into a hexagonal or square ordered pattern, with one of its blocks forming discontinuous domains standing as pillars from the substrate surface and the other blocks forming a continuous domain between them. To achieve this, the phase volume, within the block copolymer, of the block forming the continuous domain will typically be substantially greater than the phase volume of the block forming the discontinuous pillars. In order to effectively act as a graphoepitaxy template, the alignment pillars formed from the remaining resist portions will suitably be of a smaller width or diameter than the discontinuous domain pillars, such that the block forming the discontinuous domains may align onto a side-wall of the alignment pillars to direct the ordering of the block copolymer during self-assembly. In other words, the alignment pillars of the graphoepitaxy template may stand in place of the discontinuous domain pillars of the ordered block copolymer layer.

In another arrangement where the remaining resist layer is the unexposed resist portions, the patterned epitaxy template may be a chemical epitaxy template based upon the remaining resist portions.

The unexposed resist portions, in this arrangement, are left as remaining resist portions at the interface, separated by portions of bared substrate. These remaining resist portions provide a basis for a chemical epitaxy template as the patterned epitaxy template. The remaining resist portions may actually be used as the pinning or nucleation sites of the chemical epitaxy template, or may be used as a resist in subsequent processing to form the chemical epitaxy template. When the remaining resist portions are to act as pinning sites for the chemical epitaxy pattern, the resist layer may be a thin resist layer, say about 20 nm or less, such as 10 nm or less in thickness.

The remaining resist portions may remain at the interface as pinning sites of the chemical epitaxy template, the exposed resist portions having a higher chemical affinity for one block of the block copolymer than for the other block, and the bared substrate may have a similar chemically affinity for both the first and second blocks of the block copolymer. In this way, the domain of the self-assemblable block copolymer formed of the block having a high chemical affinity with the remaining resist portions will be driven by chemical affinity to position over these remaining resist portions as a self-assemblable polymer is caused to self-assemble over the chemical epitaxy template. The bared substrate, having a similar chemical affinity for both the first and second blocks of the block copolymer, allows the self-assembled or ordered block copolymer to form with its domains lying side by side in the regions lying between the remaining resist portions that are acting as pinning sites of the resulting patterned chemical epitaxy template.

In another arrangement where the unexposed resist portions act as remaining resist portions to provide basis for a chemical epitaxy template, the method may further comprise:

providing an orientation layer on the substrate, prior to providing the resist layer on the substrate, the orientation layer having a higher chemical affinity for one block, than for the other block, of the block copolymer, etching the bared substrate to remove orientation layer not lying under the remaining resist portions in order to lay bare an underlying layer of the substrate, and subsequently removing the remaining resist portions to leave portions of un-etched orientation layer on the substrate as pinning features of the chemical epitaxy template, separated by portions of the bared underlying layer, wherein the bared underlying layer has a similar chemical affinity for both the first and second blocks of the block copolymer.

In yet another arrangement where the unexposed resist portions act as remaining resist portions to provide basis for a chemical epitaxy template the bared substrate at the interface may have a higher chemical affinity for one block, than for the other block, of the block copolymer. In this arrangement, the method may further comprise:

providing a neutral orientation on the portions of bared substrate after the removing of the exposed resist portions or unexposed resist portions, the neutral orientation having a similar chemical affinity for each of the blocks of the self-assemblable block copolymer, and removing the remaining resist portions to leave bared substrate portions separated by portions of neutral orientation on the substrate as a chemical epitaxy template, with the bared substrate portions as pinning sites of the patterned epitaxy template, wherein the resulting patterned epitaxy template is a chemical epitaxy template.

In yet another suitable arrangement, the remaining resist portions may be the exposed resist portions and the remaining resist portions may be used to transfer a chemical epitaxy pattern onto the substrate as the patterned epitaxy template.

For this arrangement, when the remaining resist portions are the exposed resist portions, and wherein the block copolymer comprises first and second blocks, the method may further comprise:

providing a neutral orientation layer on the substrate, prior to providing the resist layer on the substrate, the neutral orientation layer having a similar chemical affinity for both the first and second blocks of the block copolymer, etching the bared substrate to remove neutral orientation layer not lying under the remaining resist portions in order to lay bare an underlying layer of the substrate, and subsequently removing the remaining resist portions to leave portions of un-etched neutral orientation layer on the substrate, separated by portions of the bared underlying layer, wherein the bared underlying layer has higher chemical affinity for one block, than for the other block, of the block copolymer.

When the remaining resist portions are the exposed resist portions, and wherein the block copolymer comprises first and second blocks, the method may further comprise:

providing an orientation layer on the substrate, prior to providing the resist layer on the substrate, the orientation layer having a higher chemical affinity for the second block of the block copolymer, etching the bared substrate to remove orientation layer not lying under the remaining resist portions in order to lay bare an underlying layer of the substrate, and subsequently removing the remaining resist portions to leave portions of un-etched orientation layer on the substrate, separated by portions of the bared underlying layer, wherein the bared underlying layer has higher chemical affinity for the first block of the block copolymer than for the second block. Although the orientation layer may not have a high chemical affinity for the first block, the overall enthalpy of the arrangement may still favor side-by-side alignment of the domains on the orientation layer.

For any of the arrangements set out above, the remaining resist portions, whether exposed or unexposed portions, if they exhibit thermosoftening behavior, may be heated to a temperature to permit sufficient flow of the remaining resist portions to round the shapes of the unexposed resist portions through surface area minimization. Such so-called "thermal reflow" relies upon the surface tension of the molten or softened resist to smooth out the remaining resist portions by minimizing surface area while the resist has been heated to a temperature at which it can flow under its own surface tension.

In some arrangements, the remaining resist portions, whether exposed or unexposed portions, may be exposed, or further exposed, to actinic radiation, after removal of the exposed or unexposed resist layer, in order to provide the remaining resist portions with a modified chemical affinity. This may be useful to render the remaining resist portions insoluble to a solvent used for the deposition of the self-assemblable block copolymer, or for instance, to render the remaining resist portions of a high chemical affinity for one of the blocks of the self-assemblable block copolymer compared to the other block.

In an embodiment, there is provided a method of forming an ordered block copolymer layer on a surface of a substrate, the method comprising:

providing a surface of a substrate, having a patterned epitaxy template thereon, the patterned epitaxy template provided by a method described herein, depositing a self-assemblable block polymer layer directly onto the patterned epitaxy template, and treating the self-assemblable block copolymer layer to provide self-assembly into an ordered block copolymer layer, with the ordering directed by the patterned epitaxy template.

In an embodiment, there is provided a lithography method for patterning a surface of a substrate by resist etching, wherein the method comprises providing an ordered block copolymer layer at the surface, by a method described herein of forming an ordered block copolymer layer on a surface of a substrate, wherein the ordered block copolymer layer is subsequently used as a resist layer.

In an embodiment, there is provided a method of forming a device topography at a surface of a substrate, the method comprising using the ordered block copolymer layer, formed by a method described herein of forming an ordered block copolymer layer on a surface of a substrate, as a resist layer while etching the substrate to provide the device topography.

The patterned epitaxy template, when a chemical epitaxy template, may typically comprise narrow pinning sites spaced apart by neutral regions. The patterned chemical epitaxy template may have the same periodicity (i.e. unit cell pitch) as the ordered, self-assembled block copolymer array that it is intended to direct during self-assembly, or the periodic spacing between closest adjacent pinning sites may correspond to a plurality of unit cells (say 2 or 3 unit cells) for the self-assembled polymer. This allows for the effect known as density multiplication (sometimes also referred to as pitch multiplication). So, for instance, using an example of a hexagonal self-assembled block copolymer phase, having domains whose centroids are spaced apart by a distance D, closest adjacent epitaxy or pinning features of a suitable patterned epitaxy template may be spaced apart by say D, 2D or 3D, for instance. A suitable chemical epitaxy template may, for instance, be considered as an array of pinning features identical to the ordered pattern of the assembled block copolymer, save that some of the pinning features have been omitted from the array. The greatest width of the pinning features may be, say from 0.4 to 1.5 times the width or diameter of the discontinuous domains in the ordered array. In other words, it is not essential that the narrowest pinning features of the chemical epitaxy pattern have exactly the same dimensions as the corresponding pinned domain of the self-assembled polymer.

BRIEF DESCRIPTION OF THE DRAWINGS

Specific embodiments of the invention will be described with reference to the accompanying Figures, in which:

FIGS. 6A to 6F schematically depict sequential stages of a process according to a fourth embodiment of the invention to form a chemical epitaxy template, to direct self-assembly of a block copolymer forming a hexagonal ordered pattern, in which the regular lattice pattern is a hexagonal lattice.

DETAILED DESCRIPTION

The described and illustrated embodiments are to be considered as illustrative and not restrictive in character, it being understood that only preferred embodiments have been shown and/or described and that all changes and modifications that come within the scope of the inventions as defined in the claims are desired to be protected.

Figure 1A:
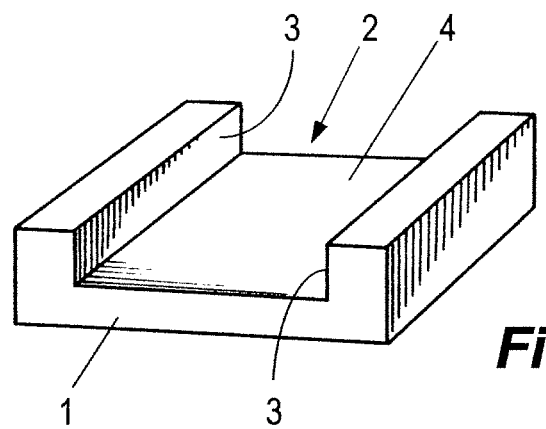
FIGS. 1A to 1C schematically depict prior art directed self-assembly of A-B block copolymers onto a substrate by graphoepitaxy and formation of relief patterns by selective etching of one domain.
Figure 1B:
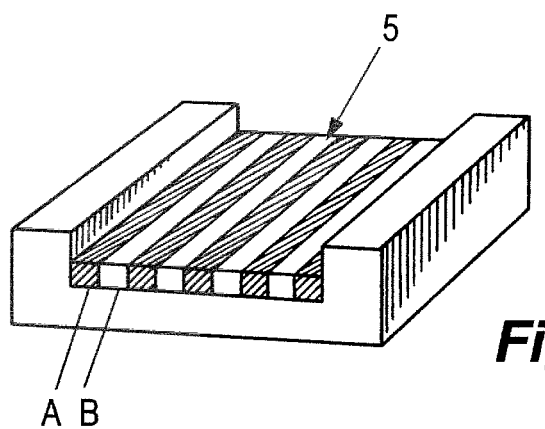
Figure 1C:
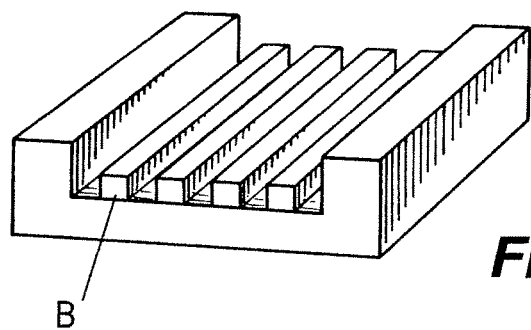

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
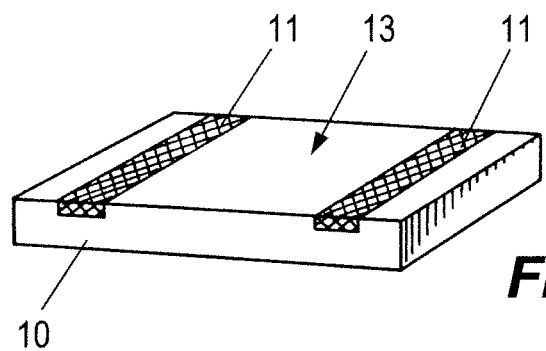
FIGS. 2A to 2C schematically depict prior art directed self-assembly of A-B block copolymers onto a substrate by chemical epitaxy and formation of relief patterns by selective etching of one domain.
Figure 2B:
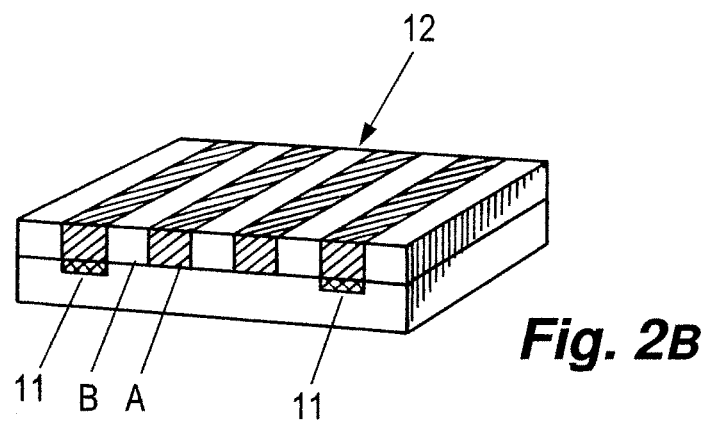
Figure 2C:
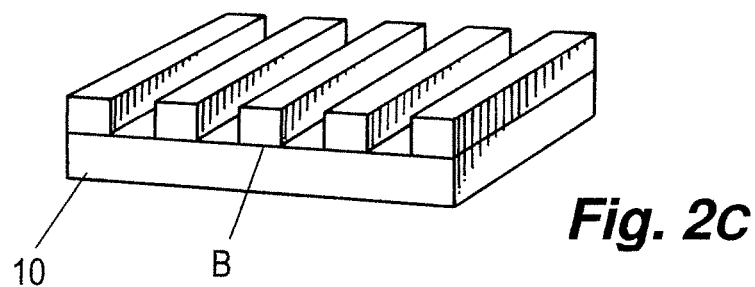

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete microseparated periodic domains during deposition of the block copolymer. This is referred to as chemical pre-patterning or chemical epitaxy. The type A domains have nucleated atop the pinning or nucleation stripes 11, which are also, e.g., hydrophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In the following examples, the di-block copolymer used as self-assemblable polymer is a poly(styrene-b-methylmethacrylate) block copolymer denoted by the acronym PS/PMMA arranged for self-assembly as a hexagonal or a square pattern having discontinuous domains, and a continuous domain, oriented side by side on the substrate. However, the method is also applicable to other self-assemblable block copolymers.

FIGS. 3A to 3E show schematically the sequential stages of a process according to a first embodiment of the invention. Each Figure represents a plan view of a substrate having a positive tone development resist layer 15 deposited on its surface and in FIG. 3A the resist layer 15 is shown after it has been exposed to UV radiation leaving unexposed resist portions 15 between exposed resist portions 14 exposed as a regular hexagonal lattice of slightly overlapping circles of diameter about 1.1 D with their centroids spaced D apart.

Figure 3A:
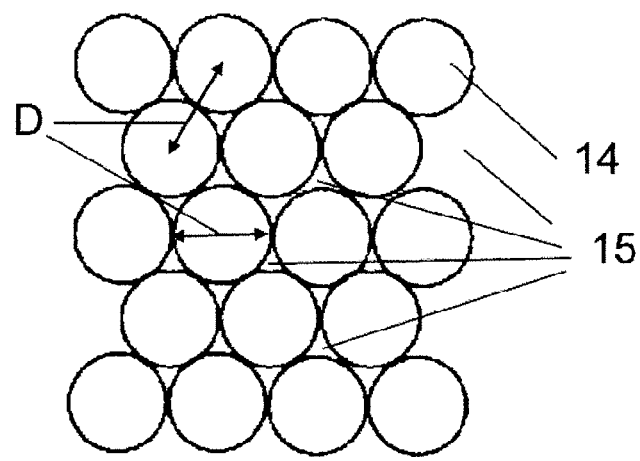
FIGS. 3A to 3E schematically depict sequential stages of a process according to a first embodiment of the invention to form a graphoepitaxy template, to direct self-assembly of a block copolymer, in which the regular lattice pattern is a hexagonal lattice.
Figure 3B:
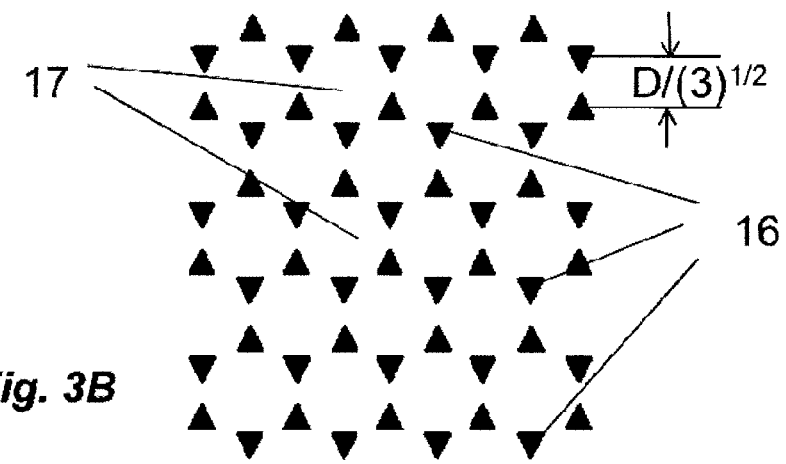

In FIG. 3B, the exposed portions of the resist layer 14 have been removed using a solvent in which the exposed resist is soluble, leaving interfacial unexposed resist portions 16 on the substrate. For a typical positive tone development resist, such as the resist used for this embodiment, the exposed resist is hydrophilic in nature whereas the unexposed resist is hydrophobic in nature. In FIG. 3B, the remaining resist portions 16 are shown after flood exposure to ultraviolet radiation in order to expose the remaining resist portions 16 to UV radiation to render the portions 16 hydrophilic in nature.

Figure 3C:
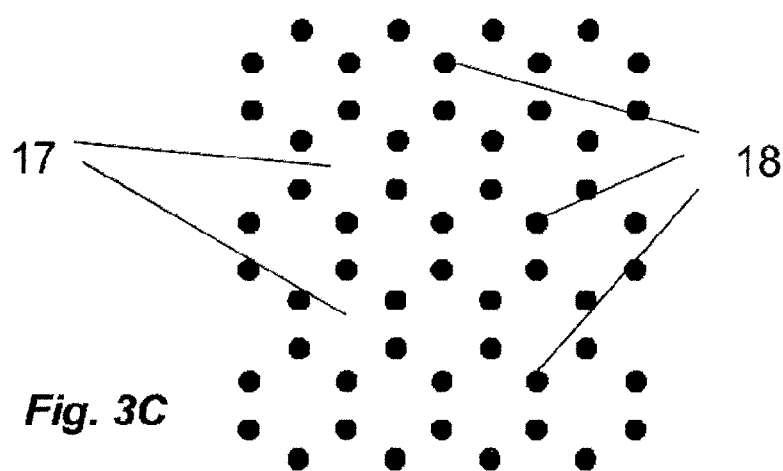

The substrate and remaining resist portions are then heated to a suitable temperature to provide thermal reflow, as explained hereinbefore, in order to render the remaining resist portions as rounded features 18, shown in FIG. 3C. It follows from the geometry of the arrangement shown that the spacing between the centroids of adjacent unexposed portions 18 of the resulting hexagonal pattern of unexposed portions 18 will be $D/(3)^{1/2}$, as indicated on FIG. 3B, where D is the spacing between the centroids of the exposed circles 14 of the original hexagonal lattice, also in this embodiment, D also being the diameter of the exposed circles as shown in FIG. 3A.

Figure 3D:
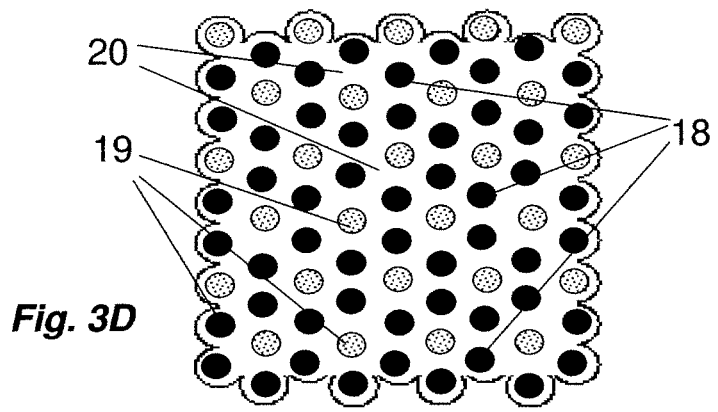

FIG. 3D shows schematically an ordered, self-assembled block copolymer layer deposited and assembled on the surface of the substrate, with self-assembly directed by the regular pattern of remaining rounded, hydrophilic, exposed resist portions 18. The remaining resist portions 18 act as alignment pillars of a resulting graphoepitaxy template, with the hydrophilic discontinuous domains 19 of the block copolymer locating themselves preferentially on the sidewalls of, and in-between, the remaining resist portions 18 during self-assembly. The bared substrate 17 between the remaining resist portions 18 is neutral in nature with respect to each of the domains (continuous domain 20 and discontinuous domain 19) of the block copolymer, and so has a similar chemical affinity for each block or domain of the block copolymer. This permits the ordered block copolymer to be assembled with the alternating domains 19, 20 positioned side-by-side on the neutral surface the substrate, with the overall positioning and orientation of the ordered block copolymer pattern controlled by the patterned graphoepitaxy template of remaining resist portions 18 pinning the hydrophilic domains 19 of the ordered pattern in place by acting as alignment pillars of the graphoepitaxy template.

Figure 3E:
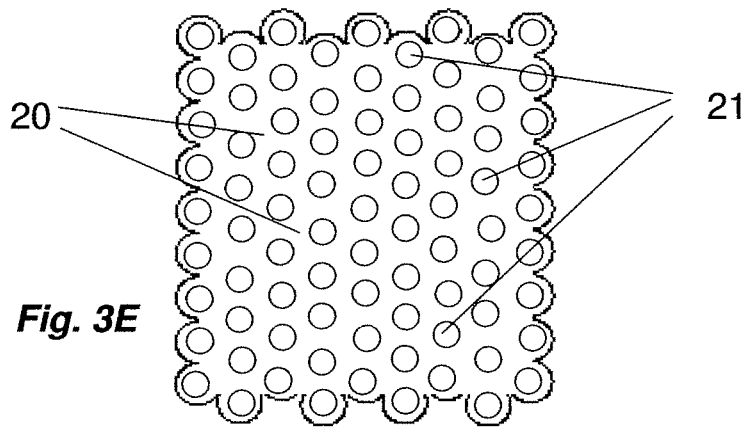

In FIG. 3E, the solidified ordered pattern has been selectively etched to remove the hydrophilic domains and hydrophilic pillars from the substrate, leaving the continuous domain 20 in place on the substrate with holes 21 suitable for use, for instance, as a means for etching contact holes into the substrate.

The arrangement described above in relation to the formation of a hexagonal patterned graphoepitaxy template may be easily modified to provide, instead, an analogous chemical epitaxy template. This is as shown in the second embodiment of the invention for which the process steps are schematically set out in FIGS. 4A to 4E.

Figure 4A:
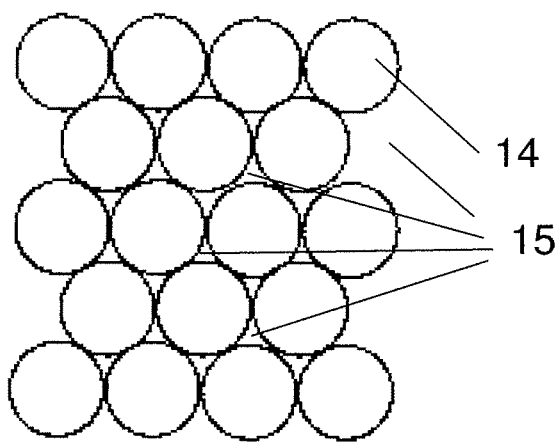
FIGS. 4A to 4E schematically depict sequential stages of a process according to a second embodiment of the invention to form a chemical epitaxy template, to direct self-assembly of a block copolymer forming a hexagonal ordered layer, in which the regular lattice pattern is a hexagonal lattice.

Again, each Figure represents a plan view of a substrate having a positive tone development resist layer 15 deposited on its surface and in FIG. 4A, the resist layer 15 is shown after it has been exposed to UV radiation leaving unexposed resist portions 15 between exposed resist portions 14 exposed as a regular hexagonal lattice of slightly overlapping circles. In this embodiment, the selective exposure to UV radiation, leaving unexposed resist portions 15 between exposed resist portions 14, exposed as a regular lattice of slightly overlapping circles, has been carried out using a thin resist layer, having a thickness of about 10 nm, consequently leaving thin interfacial unexposed resist portions at the interface, the interfacial unexposed resist portions providing the remaining resist portions 16 may act as a chemical epitaxy template having a low height comparable to their maximum width.

Figure 4B:
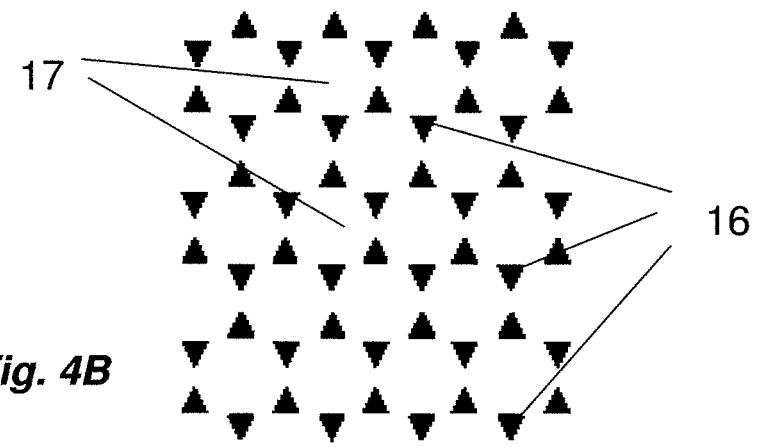

In FIG. 4B, the exposed portions of the resist layer 14 have been removed using a solvent in which the exposed resist is soluble, leaving interfacial unexposed resist portions 16 on the substrate, with any unexposed portions at the outer face of the resist layer washed away with the continuous exposed region. In FIG. 4B, the remaining resist portions 16 are shown after flood exposure to ultraviolet radiation in order to expose the remaining resist portions 16 to UV to render the portions 16 hydrophilic in nature.

Figure 4C:
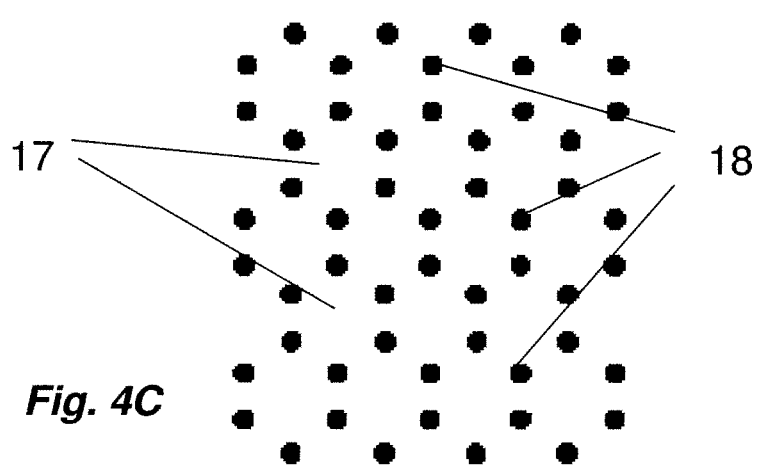

The substrate and remaining resist portions are then heated to a suitable temperature to provide thermal reflow, as explained hereinbefore, in order to render the remaining resist portions as rounded features 18, shown in FIG. 4C. It will be understood that thermal reflow is an optional step and that the method may be put into effect without thermal reflow.

Figure 4D:
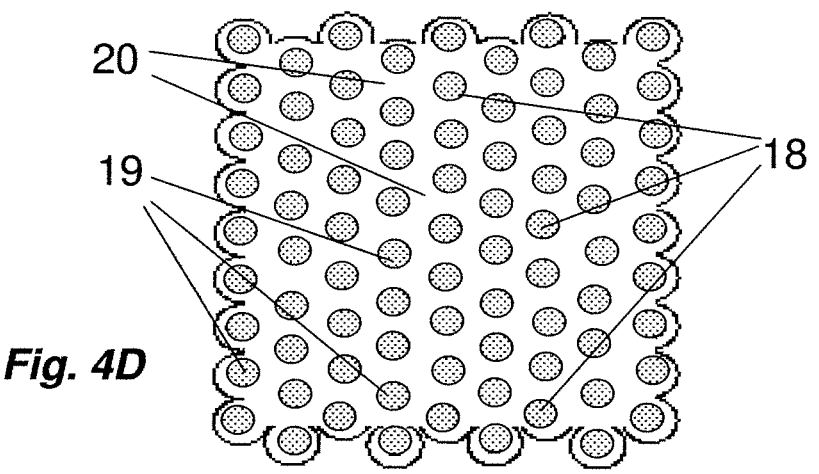

FIG. 4D shows schematically an ordered, self-assembled block copolymer layer deposited and assembled on the surface of the substrate, with self-assembly directed by the regular pattern of remaining rounded, hydrophilic, exposed resist portions 18. The remaining resist portions 18 act as pinning sites of a resulting chemical epitaxy template, with the hydrophilic discontinuous domains 19 of the block copolymer locating themselves preferentially over the remaining resist portions 18 during self-assembly. The bared substrate 17 between the remaining resist portions 18 is neutral in nature with respect to each of the domains (continuous domain 20 and discontinuous domain 19) of the block copolymer, and so has a similar chemical affinity for each block or domain of the block copolymer. This permits the ordered block copolymer to be assembled with the alternating domains 19, 20 positioned side-by-side on the neutral surface the substrate, with the overall positioning and orientation of the ordered block copolymer pattern controlled by the patterned chemical epitaxy template of hydrophilic remaining resist portions 18 pinning the hydrophilic domains 19 of the ordered pattern in place by acting as pinning sites of the chemical epitaxy template.

Figure 4E:
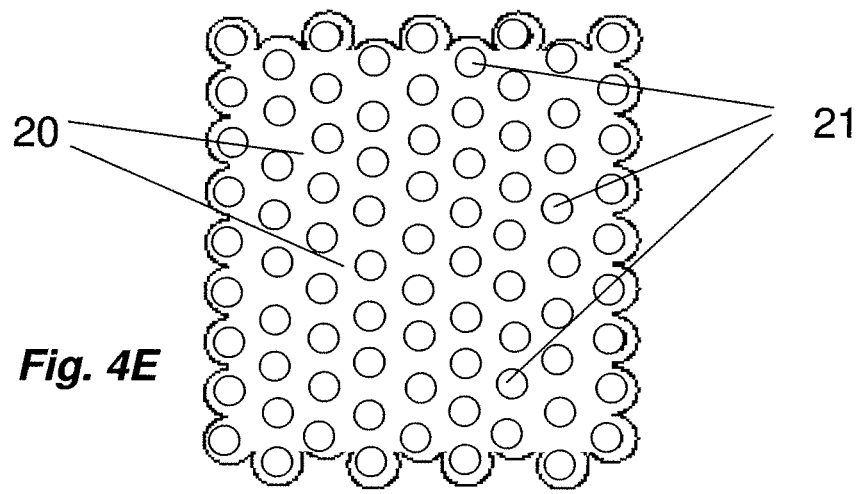

In FIG. 4E, the solidified ordered pattern has been selectively etched to remove the hydrophilic domains and hydrophilic remaining resist portions 18 from the substrate, leaving the continuous domain 20 in place on the substrate with holes 21 suitable for use, for instance, as a means for etching contact holes into the substrate.

FIGS. 5A to 5D show schematically the sequential stages of a process according to a third embodiment of the invention. Each Figure represents a plan view of a substrate having a positive tone development resist layer 15 deposited on its surface and in FIG. 3A the resist layer 15 is shown after it has been exposed to UV radiation leaving unexposed resist portions 15 between exposed resist portions 14 exposed as a regular square lattice of slightly overlapping circles.

Figure 5A:
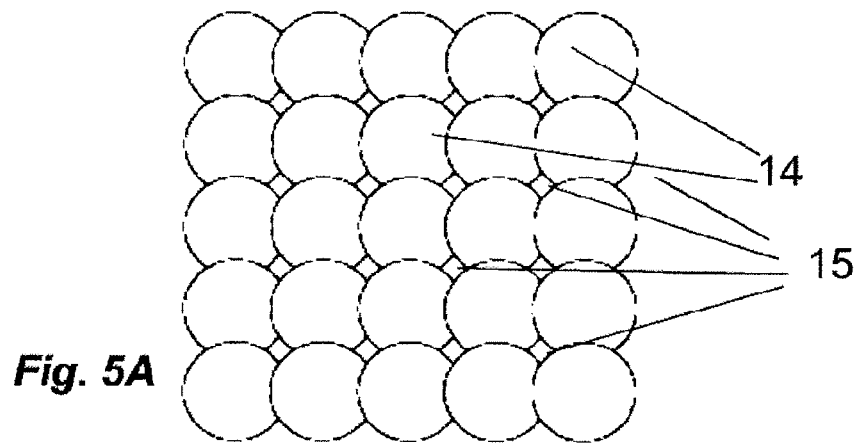
FIGS. 5A to 5D schematically depict sequential stages of a process according to a third embodiment of the invention to form a graphoepitaxy template, to direct self-assembly of a block copolymer forming a tetragonal ordered layer, in which the regular lattice pattern is a square lattice.
Figure 5B:
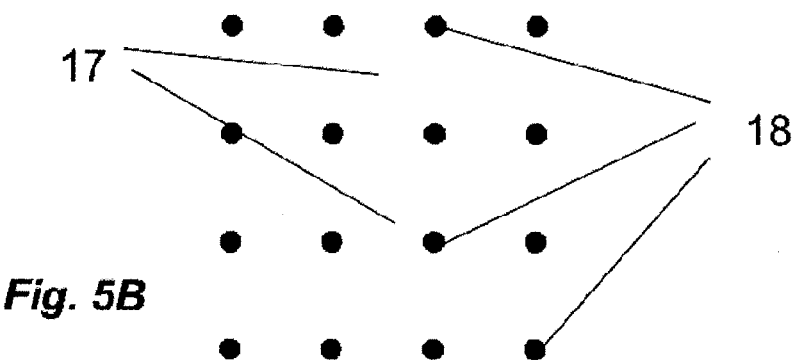

In FIG. 5B, the exposed portions of the resist layer 14 have been removed using a solvent in which the exposed resist is soluble, leaving unexposed resist portions 18 on the substrate. For a typical positive tone development resist, such as the resist used for this embodiment, the exposed resist is hydrophilic in nature whereas the unexposed resist is hydrophobic in nature. In FIG. 5B, the remaining resist portions 18 are shown after flood exposure to ultraviolet radiation in order to expose the remaining resist portions 18 to UV to render the portions 18 hydrophilic in nature. The remaining resist portions have also been subjected to thermal reflow, as explained hereinbefore, in order to render the remaining resist portions as rounded features 18, shown in FIG. 5B.

Figure 5C:
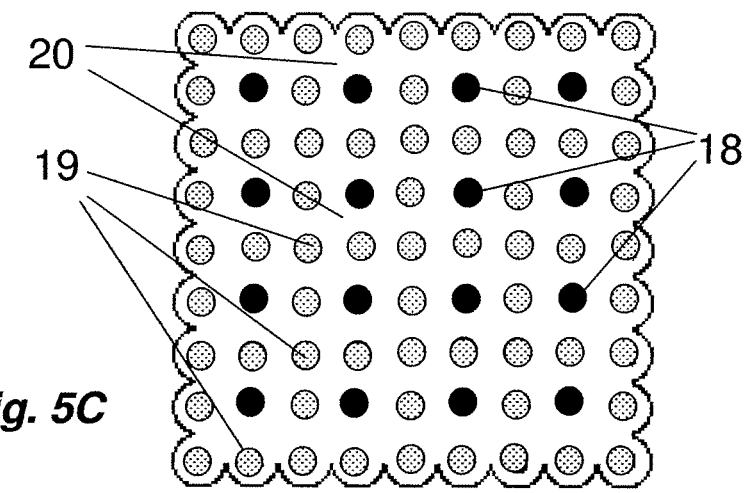

FIG. 5C shows schematically an ordered, self-assembled block copolymer layer deposited and assembled on the surface of the substrate, with self-assembly directed by the regular pattern of remaining rounded, hydrophilic, exposed resist portions 18. The remaining resist portions 18 act as alignment pillars of a resulting graphoepitaxy template, with the hydrophilic discontinuous domains 19 of the block copolymer locating themselves preferentially on the sidewalls of, and in-between, the remaining resist portions 18 during self-assembly. The bared substrate 17 between the remaining resist portions 18 is neutral in nature with respect to each of the domains (continuous domain 20 and discontinuous domain 19) of the block copolymer, and so has a similar chemical affinity for each block or domain of the block copolymer. This permits the ordered block copolymer to be assembled with the alternating domains 19, 20 positioned side-by-side on the neutral surface the substrate, with the overall positioning and orientation of the ordered block copolymer pattern controlled by the patterned graphoepitaxy template of remaining resist portions 18 pinning the hydrophilic domains 19 of the ordered pattern in place by acting as alignment pillars of the graphoepitaxy template.

Figure 5D:
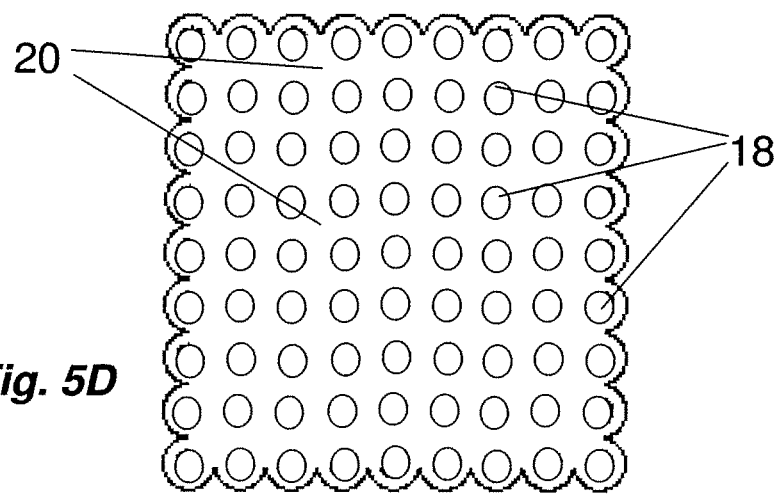

In FIG. 5D, the solidified ordered pattern has been selectively etched to remove the hydrophilic domains and hydrophilic pillars from the substrate, leaving the continuous domain 20 in place on the substrate with holes 21 suitable for use, for instance, as a means for etching contact holes into the substrate.

A further embodiment of the invention, not illustrated, but based on the process described herein, may use hydrophobic, rather than hydrophilic, pinning sites for the patterned epitaxy template (for instance by omitting the flood exposure step from the process).

In yet another embodiment of the invention, as has already explained hereinbefore, the remaining resist portions 18 may be used as a resist for further etching of underlying layers of the substrate in order to provide a chemical epitaxy pattern.

In a further embodiment of the invention, as already explained hereinbefore, a neutral orientation layer may be deposited over the remaining resist portions 18 with these subsequently removed to bare the substrate at the locations where the remaining resist portions 18 were previously sited. For this embodiment, the chemical epitaxy pattern is formed by the bared substrate alternating with the regions of deposited neutral orientation layer.

FIGS. 6A to 6F schematically depict sequential stages of a process according to a fourth embodiment of the invention to form a chemical epitaxy template, to direct self-assembly of a block copolymer forming a hexagonal ordered pattern, in which the regular lattice pattern has an arrangement of pinning sites located on a hexagonal lattice. For this fourth illustrated embodiment, the exposed resist remains in place as remaining resist portions to provide a basis for the chemical epitaxy pattern by transfer etching, as set out below.

FIGS. 6A and 6B respectively show plan and side cross-sectional views (along section A-A) of a substrate 22 having a neutral orientation layer 20 provided on its surface and a resist layer 21 resist layer shown after it has been exposed to UV radiation leaving exposed resist portions 21 as a regular hexagonal lattice of slightly overlapping circles, with triangular regions of bared neutral orientation layer where the unexposed resist regions have been removed by a suitable solvent wash. As with the previous Examples, the exposed circles are spaced apart in a hexagonal lattice with the centroids of adjacent circles a distance D apart, and with the exposed circles having a diameter greater than D, but less than $2D/(3)^{1/2}$ to provide overlap (in this Example, the diameters are about 1.1D).

Subsequently, the substrate is subjected to a chemical etch to remove the bared triangular regions of neutral orientation layer 20 where there is no overlying resist 21. Prior to the chemical etch, the resist layer 21 may be subjected to thermal reflow. The result, following the chemical etching and subsequent removal of resist 21, by means of a suitable solvent, is shown in FIGS. 6C and 6D, which are schematic plan and side cross-sectional views (along section A-A) respectively. A patterned chemical epitaxy template of discontinuous triangular regions of bared substrate 22 has been formed, alternating with portions of a continuous region of the neutral orientation layer 20.

In FIGS. 6E (plan view) and 6F (side cross-sectional view along section A-A) a layer of block copolymer has been self-assembled over the substrate, using the patterned chemical epitaxy template to direct self-assembly. The ordered block copolymer layer has discontinuous domains 24 arranged in a hexagonal pattern with a continuous domain 23 between the discontinuous pillars of domains 24. The discontinuous pillar domains 24 are preferentially located over the bared substrate 22 which has a higher chemical affinity for domain 24 than for domain 23. The domains may orient side-by-side over the portions of neutral orientation layer 20 as this has a similar chemical affinity for each of the domain types 23, 24. This means that each pillar of domain 24 does not require a corresponding pinning region of bare substrate 22 in the underlying chemical epitaxy pattern.

It will be evident that the fourth embodiment may be easily modified to provide a chemical epitaxy template based on a square, rather than on a hexagonal lattice.

An embodiment of the invention allows for formation, onto a substrate, of a patterned epitaxy template, with closely spaced features of sub-resolution width, by a simple, direct photolithography method using actinic radiation such as UV or DUV radiation, without need for complex and/or undesirable process steps or complex lift-off etch processes for removal of residual resist.

An embodiment of the present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 1 μm or less, typically about 100 nm or less or even about 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate, or may include one or more other layers such as those specifically mentioned above with reference to particular embodiments of the invention.

The invention claimed is:

1. A method of forming a patterned epitaxy template on a substrate, for orientation of a self-assemblable block copolymer, the method comprising:

selectively exposing a resist layer on the substrate with actinic radiation by a photolithographic method to provide exposed resist portions in a regular lattice pattern of touching or overlapping shapes arranged to leave unexposed resist portions therebetween, wherein at least one of the shapes does not cross over at least one of the other shapes, and removing the exposed resist portions or the unexposed resist portions to leave the remaining resist portions on the substrate, separated by portions of bared substrate, wherein the remaining resist portions provide a basis for the patterned epitaxy template.

2. The method of claim 1, wherein the regular lattice pattern is a hexagonal pattern.

3. The method of claim 1, wherein the regular lattice pattern is a square pattern.

4. The method of claim 1, wherein the photolithographic method has a resolution capable of exposing a shape having a minimum width, and the unexposed portions have a maximum width less than the minimum width.

5. The method of claim 1, wherein the remaining resist portions are the unexposed resist portions.

6. The method of claim 5, wherein the patterned epitaxy template is a graphoepitaxy template formed from the remaining resist portions.

7. The method of claim 6, wherein the block copolymer comprises first and second blocks and wherein the remaining resist portions remain at the interface as alignment pillars of the graphoepitaxy template, the remaining resist features having a higher chemical affinity for one block, than for the other block, of the block copolymer and the bared substrate having a similar chemically affinity for both the first and second blocks of the block copolymer.

8. The method of claim 5, wherein the patterned epitaxy template is a chemical epitaxy template based upon the remaining resist portions.

9. The method of claim 8, wherein the block copolymer comprises first and second blocks and wherein the remaining resist portions remain at the interface as pinning features of the chemical epitaxy template, the remaining resist portions having a higher chemical affinity for one block, than for the other block, of the block copolymer, and wherein the bared substrate has a similar chemically affinity for both the first and second blocks of the block copolymer.

10. The method of claim 8, wherein the block copolymer comprises first and second blocks and the method further comprises:

providing an orientation layer on the substrate prior to providing the resist layer on the substrate, the orientation layer having a higher chemical affinity for one block, than for the other block, of the block copolymer, etching the bared substrate to remove orientation layer not lying under the remaining resist portions in order to lay bare an underlying layer of the substrate, and subsequently removing the remaining resist portions to leave portions of un-etched orientation layer on the substrate as pinning features of the chemical epitaxy template, separated by portions of the bared underlying layer, wherein the bared underlying layer has a similar chemical affinity for both the first and second blocks of the block copolymer.

11. The method of claim 8, wherein the block copolymer comprises first and second blocks and wherein the bared substrate at the interface has a higher chemical affinity for one block, than for the other block, of the block copolymer, and the method further comprises:

providing a neutral orientation on the portions of bared substrate after the removing, the neutral orientation having a similar chemical affinity for each of the blocks of the block copolymer, and removing the remaining resist portions to leave bared substrate portions separated by portions of neutral orientation on the substrate as a chemical epitaxy template, with the bared substrate portions as pinning sites of the patterned epitaxy template, wherein the resulting patterned epitaxy template is a chemical epitaxy template.

12. The method of claim 1, wherein the remaining resist portions are the exposed resist portions and the remaining resist portions are used to transfer a chemical epitaxy pattern onto the substrate as the patterned epitaxy template.

13. The method of claim 12, wherein the block copolymer comprises first and second blocks and the method further comprises:

providing an neutral orientation layer on the substrate, prior to providing the resist layer on the substrate, the neutral orientation layer having a similar chemical affinity for both the first and second blocks of the block copolymer, etching the bared substrate to remove neutral orientation layer not lying under the remaining resist portions in order to lay bare an underlying layer of the substrate, and subsequently removing the remaining resist portions to leave portions of un-etched neutral orientation layer on the substrate, separated by portions of the bared underlying layer, wherein the bared underlying layer has higher chemical affinity for one block, than for the other block, of the block copolymer.

14. The method of claim 12, wherein the block copolymer comprises first and second blocks, and the method further comprises:

providing an orientation layer on the substrate, prior to providing the resist layer on the substrate, the orientation layer having a higher chemical affinity for the second block of the block copolymer, etching the bared substrate to remove orientation layer not lying under the remaining resist portions in order to lay bare an underlying layer of the substrate, and subsequently removing the remaining resist portions to leave portions of un-etched orientation layer on the substrate, separated by portions of the bared underlying layer, wherein the bared underlying layer has higher chemical affinity for the first block, than for the second block, of the self-assemblable block copolymer.

15. The method of claim 1, wherein the remaining resist portions exhibit thermosoftening and are heated to a temperature to permit sufficient flow of the remaining resist portions to round the shapes of the remaining resist portions through surface area minimization.

16. The method of claim 1, wherein the remaining resist portions are exposed to actinic radiation, after removal of the exposed or unexposed resist layer, to provide the remaining resist portions with a modified chemical affinity.

17. The method of claim 1, wherein the shapes are circles.

18. A method of forming an ordered block copolymer layer on a surface of a substrate, the method comprising:

providing a surface of a substrate, having a patterned epitaxy template thereon, the patterned epitaxy template provided by the method of claim 1, depositing a self-assemblable block copolymer layer directly onto the patterned epitaxy template, and treating the self-assemblable block copolymer layer to provide self-assembly into an ordered block copolymer layer, with the ordering directed by the patterned epitaxy template.

19. A lithography method for patterning a surface of a substrate by resist etching, wherein the method comprises providing an ordered block copolymer layer at the surface by the method of claim 18, wherein the ordered block copolymer layer is subsequently used as a resist layer.

20. A method of forming a device topography at a surface of a substrate, the method comprising using the ordered block copolymer layer formed by the method of claim 18 as a resist layer while etching the substrate to provide the device topography.

21. A method of forming a patterned epitaxy template on a substrate, for orientation of a self-assemblable block copolymer, the method comprising:

selectively exposing a resist layer on the substrate with actinic radiation by a photolithographic method to provide exposed resist portions in a regular lattice pattern of touching or overlapping shapes arranged to leave unexposed resist portions therebetween;

removing the exposed resist portions or the unexposed resist portions to leave the remaining resist portions on the substrate, separated by portions of bared substrate; and providing the locations of the remaining resist portions with a different chemical affinity for the block copolymer than that of an area surrounding each of the remaining resist portions such that the locations of the remaining resist portions and the areas surrounding each of the remaining resist portions form the patterned epitaxy template.

* * * * *